United States Patent
Kajiwara et al.

(10) Patent No.: US 12,396,228 B2
(45) Date of Patent: Aug. 19, 2025

(54) SEMICONDUCTOR DEVICE

(71) Applicant: KABUSHIKI KAISHA TOSHIBA, Tokyo (JP)

(72) Inventors: Yosuke Kajiwara, Yokohama (JP); Aya Shindome, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 554 days.

(21) Appl. No.: 17/809,714

(22) Filed: Jun. 29, 2022

(65) Prior Publication Data
US 2023/0187500 A1 Jun. 15, 2023

(30) Foreign Application Priority Data
Dec. 14, 2021 (JP) .................................. 2021-202188

(51) Int. Cl.
*H10D 62/13* (2025.01)
*H10D 30/01* (2025.01)
(Continued)

(52) U.S. Cl.
CPC ......... *H10D 62/161* (2025.01); *H10D 30/015* (2025.01); *H10D 30/475* (2025.01); *H10D 62/824* (2025.01); *H10D 62/8503* (2025.01)

(58) Field of Classification Search
CPC ............. H01L 29/0891; H01L 29/2003; H01L 29/205; H01L 29/66462; H01L 29/7786
(Continued)

(56) References Cited

U.S. PATENT DOCUMENTS

| 5,572,060 A | 11/1996 | Butler et al. |
| 5,719,429 A * | 2/1998 | Yoshida ............... H01L 29/4925 257/E29.12 |

(Continued)

FOREIGN PATENT DOCUMENTS

| JP | 2003-332573 | 11/2003 |
| JP | 3593371 | 11/2004 |

(Continued)

OTHER PUBLICATIONS

Spera et al., Energies 2019, 12, 2655 (Year: 2019).*

(Continued)

*Primary Examiner* — Christine S. Kim
*Assistant Examiner* — Nathalie R Fayette
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor regions, and a first member. The first semiconductor region includes $Al_{x1}Ga_{1-x1}N$ (0≤x1<1). The second semiconductor region includes $Al_{x2}Ga_{1-x2}N$ (x1<x2≤1). The first member includes first and second regions. The second region is between the first region and the first electrode region of the second electrode. A part of the second region is between the second semiconductor portion of the second semiconductor region and the second electrode region. The second region includes at least one first element selected from the group consisting of Ti, Al, Ga, Ni, Nb, Mo, Ta, Hf, V, and Au. The first region does not include the first element, or a concentration of the first element in the first region is lower than a concentration of the first element in the second region.

19 Claims, 13 Drawing Sheets

(51) Int. Cl.
*H10D 30/47* (2025.01)
*H10D 62/824* (2025.01)
*H10D 62/85* (2025.01)

(58) Field of Classification Search
USPC .......................................................... 257/192
See application file for complete search history.

(56) References Cited

U.S. PATENT DOCUMENTS

| 11,189,718 | B2* | 11/2021 | Kuraguchi | ........ H01L 29/42364 |
| 2013/0099285 | A1* | 4/2013 | Hwang | ............... H01L 29/1608 |
| | | | | 257/E29.246 |
| 2020/0105917 | A1* | 4/2020 | Okita | .................... H01L 29/205 |
| 2021/0175330 | A1* | 6/2021 | Makiyama | ........ H01L 21/02356 |

FOREIGN PATENT DOCUMENTS

| JP | 2017-199700 A | 11/2017 |
| JP | 2018-110138 A | 7/2018 |
| JP | 2020-53585 A | 4/2020 |
| JP | 2020-198327 A | 12/2020 |
| JP | 2021-9886 A | 1/2021 |

OTHER PUBLICATIONS

Kochermin, Artur ("Rigorous Investigation of AlGaN/GaN Heterostructure Surface Treatments with Si Thin Films." ProQuest Dissertations & Theses, 2011 (Year: 2011).*

Jhang-Jie Jian et al. (2021). Investigation of multi-mesa-channel-structured AlGaN/GaN MOSHEMTs with SiO2 gate oxide layer. Coatings, 11(12), 1494 (Year: 2021).*

Polysilicon. (n.d.) Computer Desktop Encyclopedia. (1981-2019). Retrieved Nov. 26, 2024 (Year: 2024).*

3. Chen Fu et al. Superlattices and Microstructures, vol. 111, Nov. 2017, pp. 806-815: Determination of the strain distribution for the Si3N4 passivated AlGaN/AlN/GaN heterostructure field-effect transistors (Year: 2017).*

Polysilicon Definition (Year: 2024).*

* cited by examiner

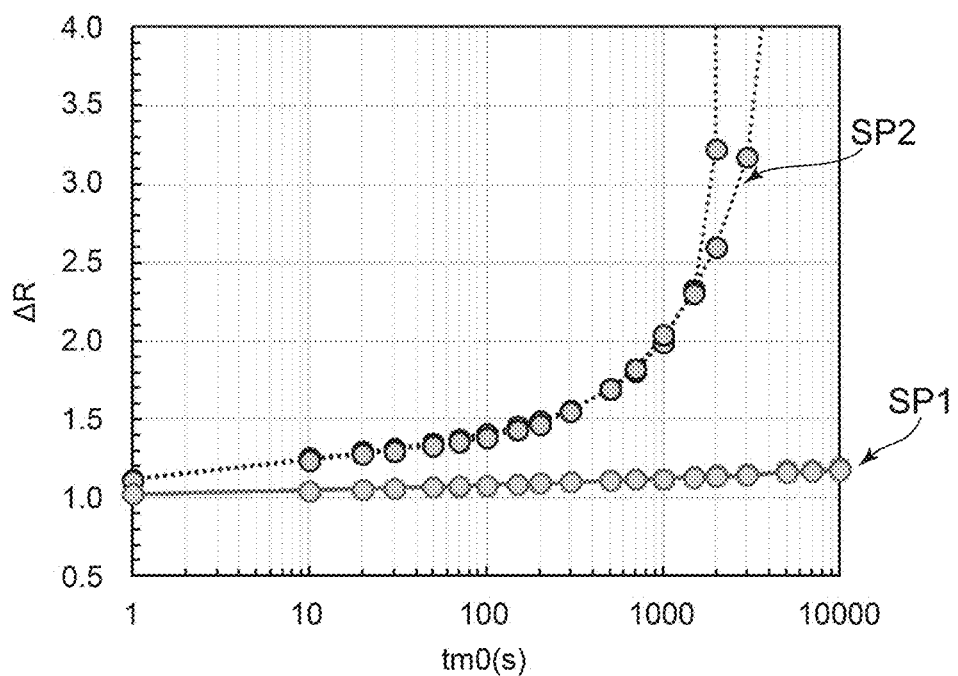
FIG. 3
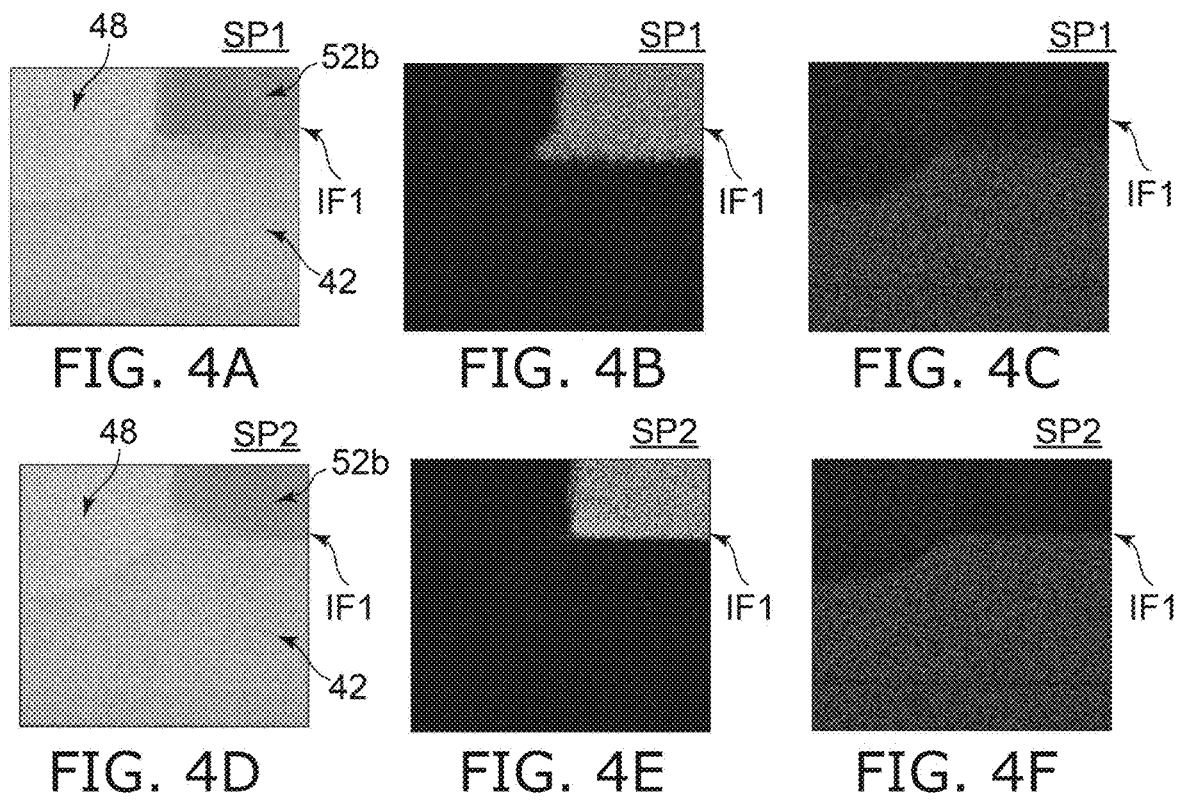
FIG. 4A    FIG. 4B    FIG. 4C
FIG. 4D    FIG. 4E    FIG. 4F

SEMICONDUCTOR DEVICE

CROSS-REFERENCE TO RELATED APPLICATIONS

This application is based upon and claims the benefit of priority from Japanese Patent Application No. 2021-202188, filed on Dec. 14, 2021; the entire contents of which are incorporated herein by reference.

FIELD

Embodiments described herein relate generally to semiconductor device.

BACKGROUND

For example, in a semiconductor device such as a transistor, stable characteristics are desired.

BRIEF DESCRIPTION OF THE DRAWINGS

FIG. 3 is a graph illustrating characteristics of the semiconductor device;

FIGS. 4A to 4F are analysis images of the semiconductor device according to the embodiment;

DETAILED DESCRIPTION

Figure 1:
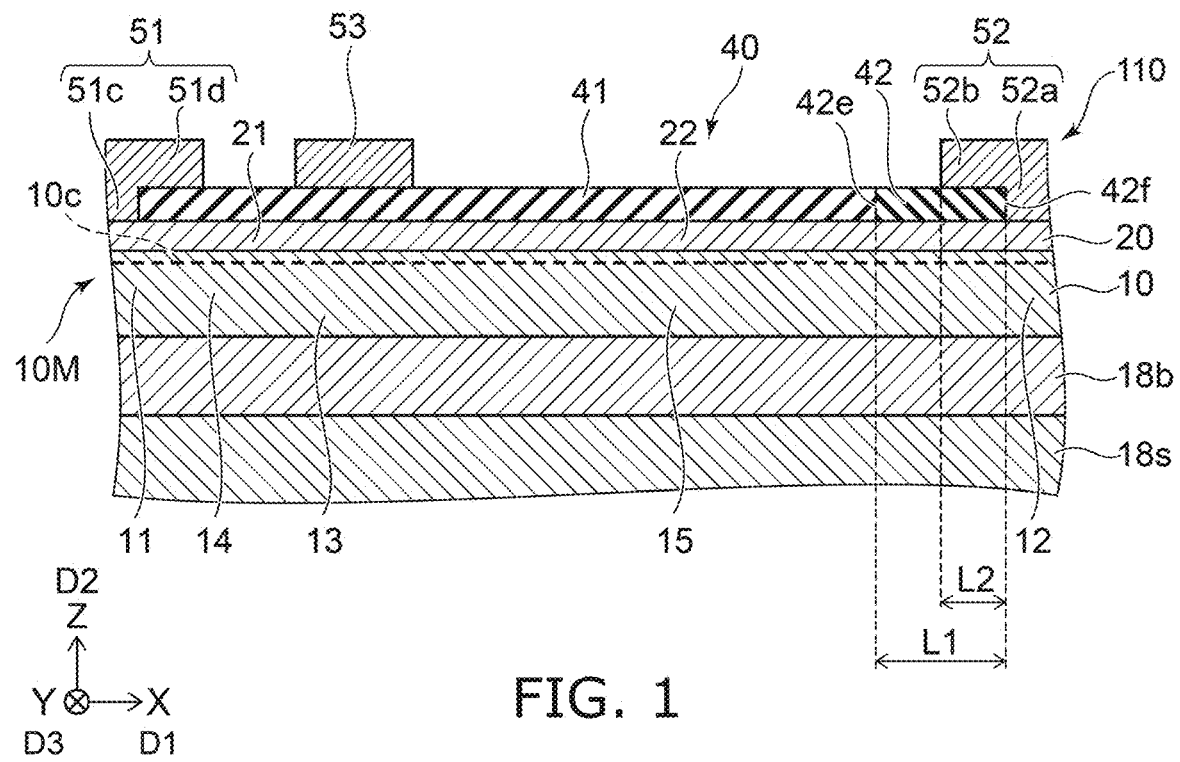
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, and a first member. A direction from the first electrode to the second electrode is along a first direction. The second electrode includes a first electrode region and a second electrode region. A position in the first direction of the third electrode is between a position in the first direction of the first electrode and a position in the first direction of the second electrode. The first semiconductor region includes $Al_{x1}Ga_{1-x1}N$ ($0 \leq x1 < 1$). The first semiconductor region includes a first partial region, a second partial region, a third partial region, a fourth partial region, and a fifth partial region. A direction from the first partial region to the first electrode is along a second direction crossing the first direction. A direction from the second partial region to the second electrode is along the second direction. A direction from the third partial region to the third electrode is along the second direction. The fourth partial region is between the first partial region and the third partial region in the first direction. The fifth partial region is between the third partial region and the second partial region in the first direction. The second semiconductor region includes $Al_{x2}Ga_{1-x2}N$ ($x1 < x2 \leq 1$). The second semiconductor region includes a first semiconductor portion and a second semiconductor portion. A direction from the fourth partial region to the first semiconductor portion is along the second direction. A direction from the fifth partial region to the second semiconductor portion is along the second direction. The first member includes a first region and a second region. The second semiconductor portion is between the fifth partial region and the first region in the second direction. At least a part of the second region is between at least a part of the first region and the first electrode region in the first direction. The at least a part of the second region is between the second semiconductor portion and the second electrode region in the second direction. The second region includes at least one first element selected from the group consisting of Ti, Al, Ga, Ni, Nb, Mo, Ta, Hf, V, and Au. The first region does not include the first element, or a concentration of the first element in the first region is lower than a concentration of the first element in the second region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the first embodiment includes a first electrode 51, a second electrode 52, a third electrode 53, a first semiconductor region 10, a second semiconductor region 20, and a first member 40.

A direction from the first electrode 51 to the second electrode 52 is along a first direction D1. The first direction D1 is defined as an X-axis direction. One direction perpendicular to the X-axis direction is defined as a Z-axis direction. A direction perpendicular to the X-axis direction and the Z-axis direction is defined as a Y-axis direction.

The second electrode 52 includes a first electrode region 52a and a second electrode region 52b.

A position of the third electrode 53 in the first direction D1 is between a position of the first electrode 51 in the first direction D1 and a position of the second electrode 52 in the first direction D1. For example, the third electrode 53 is between the first electrode 51 and the second electrode 52 in the first direction D1.

The first semiconductor region 10 includes $Al_{x1}Ga_{1-x1}N$ ($0 \leq x1 < 1$). In one example, a composition ratio x1 is not less than 0 and not more than 0.1. The first semiconductor region 10 is, for example, a GaN layer.

The first semiconductor region 10 includes a first partial region 11, a second partial region 12, a third partial region 13, a fourth partial region 14, and a fifth partial region 15. A direction from the first partial region 11 to the first electrode 51 is along the second direction D2. The second direction D2 crosses the first direction D1. The second direction D2 is, for example, the Z-axis direction.

A direction from the second partial region 12 to the second electrode 52 is along the second direction D2. A direction from the second partial region 12 to at least a part of the second electrode 52 is along the second direction D2. A direction from the third partial region 13 to the third electrode 53 is along the second direction D2. The fourth partial region 14 is between the first partial region 11 and the third partial region 13 in the first direction D1. The fifth partial region 15 is between the third partial region 13 and the second partial region 12 in the first direction D1.

The first partial region 11 is, for example, a region that overlaps the first electrode 51 in the Z-axis direction. The second partial region 12 is, for example, a region that overlaps the second electrode 52 in the Z-axis direction. The third partial region 13 is, for example, a region that overlaps the third electrode 53 in the Z-axis direction.

The second semiconductor region 20 includes $Al_{x2}Ga_{1-x2}N$ ($x1 < x2 \leq 1$). In one example, a composition ratio x2 is not less than 0.05 and not more than 0.35. The second semiconductor region 20 is, for example, an AlGaN layer.

The second semiconductor region 20 includes a first semiconductor portion 21 and a second semiconductor portion 22.

A direction from the fourth partial region 14 to the first semiconductor portion 21 is along the second direction D2. A direction from the fifth partial region 15 to the second semiconductor portion 22 is along the second direction D2.

For example, the first electrode 51 is electrically connected with the first semiconductor portion 21. The second electrode 52 is electrically connected with the second semiconductor portion 22.

A current flowing between the first electrode 51 and the second electrode 52 can be controlled by a potential of the third electrode 53. The potential of the third electrode 53 may be, for example, a potential based on a potential of the first electrode 51. For example, a distance between the first electrode 51 and the third electrode 53 is shorter than a distance between the second electrode 52 and the third electrode 53. The first electrode 51 functions as, for example, a source electrode. The second electrode 52 functions as, for example, a drain electrode. The third electrode 53 functions as, for example, a gate electrode. The semiconductor device 110 is, for example, a transistor.

The first semiconductor region 10 and the second semiconductor region 20 are included in a semiconductor member 10M. The first semiconductor region 10 includes a portion facing the second semiconductor region 20. A carrier region 10c is formed in the facing portion. The carrier region 10c is, for example, a two-dimensional electron gas. The semiconductor device 110 is, for example, a HEMT (high electron mobility transistor).

In the second electrode 52, the first electrode region 52a is in contact with, for example, the second semiconductor portion 22. The second electrode region 52b projects toward the third electrode 53 with reference to the first electrode region 52a. The second electrode region 52b is a protruding portion or an eaves portion.

As shown in FIG. 1, the first electrode 51 may include a third electrode region 51c and a fourth electrode region 51d. The third electrode region 51c is in contact with, for example, the first semiconductor portion 21. The fourth electrode region 51d projects toward the third electrode 53 with reference to the third electrode region 51c. The fourth electrode region 51d is a protruding portion or an eaves portion. By providing these protruding portions, it is easy to obtain a stable electrode shape. For example, the margin in the manufacturing process is expanded, and a practical semiconductor device can be obtained.

As shown in FIG. 1, the semiconductor device 110 may include a base body 18s and a buffer layer 18b. The base body 18s may include, for example, a silicon substrate or a sapphire substrate. The buffer layer 18b is between the base body 18s and the semiconductor member 10M. The buffer layer 18b is provided on the base body 18s. The first semiconductor region 10 is provided on the buffer layer 18b. The second semiconductor region 20 is provided on the first semiconductor region 10. The first to third electrodes 51 to 53 are provided on the second semiconductor region 20.

The first member 40 includes a first region 41 and a second region 42. The second semiconductor portion 22 is between the fifth partial region 15 and the first region 41 in the second direction D2. At least a part of the second region 42 is between at least a part of the first region 41 and the first electrode region 52a in the first direction D1. At least a part of the second region 42 is between the second semiconductor portion 22 and the second electrode region 52b in the second direction D2.

The first semiconductor portion 21 is between the fourth partial region 14 and a part of the first region 41. For example, the first semiconductor portion 21 is protected by a part of the first region 41. It is easy to obtain more stable characteristics. In this example, another part of the first region 41 is between the third partial region 13 and the third electrode 53. Another part of the first region 41 functions as a gate insulating film.

In the first configuration according to the embodiment, the second region 42 includes at least one first element selected from the group consisting of Ti, Al, Ga, Ni, Nb, Mo, Ta, Hf, V and Au. On the other hand, the first region 41 does not include the first element. Alternatively, a concentration of the first element in the first region 41 is lower than a concentration of the first element in the second region 42. As will be described later, the second configuration or the third configuration may be applied. Stable characteristics can be obtained in the semiconductor device having the first configuration as described above.

For example, in the semiconductor device 110, if the second electrode 52 is provided with the second electrode region 52b (protruding portion), the on-resistance may increase. For example, current collapse occurs. It is considered that this is due to the presence of a trap in an insulating film between the second electrode region 52b and the semiconductor member 10M. It is considered that the on-resistance increases due to the charge trapped in the trap in the insulating film.

In the embodiment, the above-mentioned first element is introduced into the second region 42 located below the second electrode region 52b. It is considered that introduction of the first element substantially eliminates the traps in the second region 42. As a result, the increase in on-resistance is suppressed.

Hereinafter, examples of experimental results relating to semiconductor devices will be described. First, a method for manufacturing an experimental sample will be described.

Figure 2A:
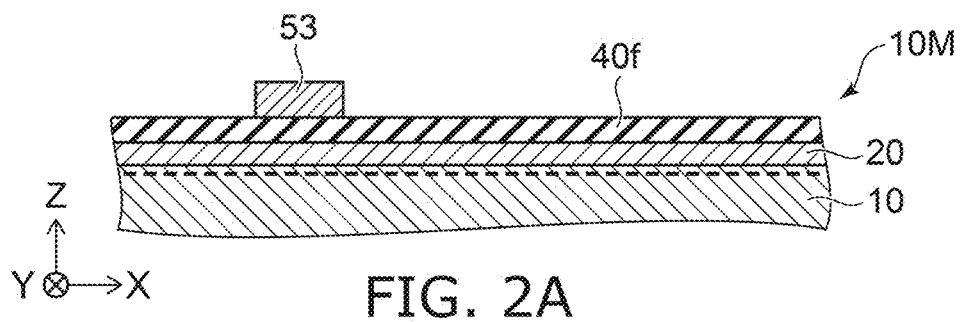
FIGS. 2A to 2C are schematic cross-sectional views illustrating a method for manufacturing the semiconductor device according to the first embodiment.
Figure 2B:
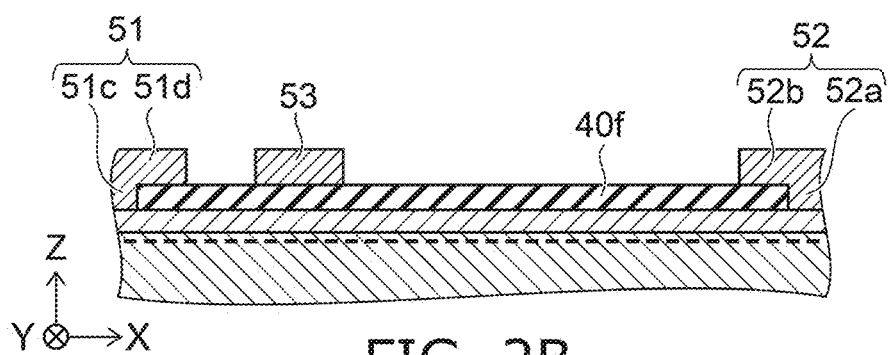
Figure 2C:
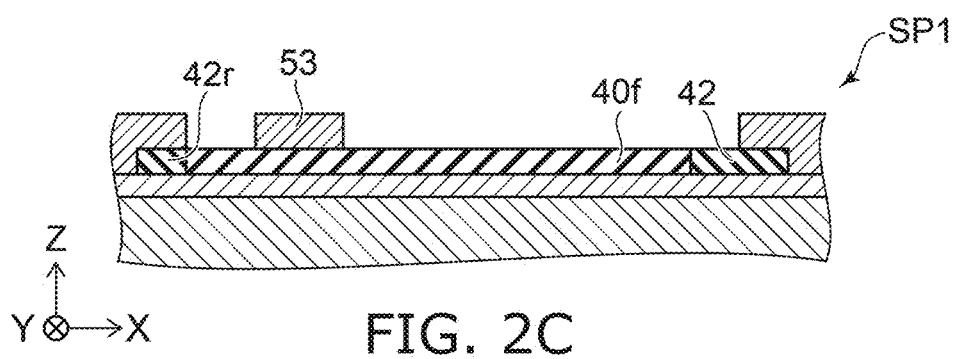

FIGS. 2A to 2C are schematic cross-sectional views illustrating a method for manufacturing the semiconductor device according to the first embodiment.

In these figures, the base body 18s and the buffer layer 18b are omitted. As shown in FIG. 2A, the second semiconductor region 20 is provided on the first semiconductor region 10. A first member film 40f, which is the first member 40, is provided on the second semiconductor region 20. The first member film 40f is, for example, a silicon nitride film. In this example, the third electrode 53 is provided on the first member film 40f.

As shown in FIG. 2B, a part of the first member film 40f is removed. The first electrode 51 and the second electrode 52 are formed in the removed region. In this example, the first electrode 51 and the second electrode 52 include the first element. Then, heat treatment is performed at a high temperature.

As a result, as shown in FIG. 2C, a part of the first element included in the second electrode 52 moves (diffuses) into the first member film 40f. As a result, the second region 42 including the first element is formed. In this example, a part of the first element included in the first electrode 51 moves (diffuses) into the first member film 40f. As a result, a region 42r including the first element is also formed in the vicinity of the first electrode 51. In this example, the first element is Al.

A first sample SP1 is formed by the above method. On the other hand, a second sample is formed in the same manner. In the second sample, a temperature of the above heat treatment is lower than a temperature in the first sample SP1. In the second sample, the second region 42 does not include the first element.

FIG. 3 is a graph illustrating characteristics of the semiconductor device.

FIG. 3 illustrates an on-resistance during a stress test in the first sample SP1 and the second sample SP2. In the stress test, a measurement environmental temperature is 150° C. and a drain stress voltage is 900 V. The horizontal axis of FIG. 3 is a stress time tm0. The vertical axis of FIG. 3 is a rate of increase ΔR of the on-resistance. The rate of increase ΔR is a ratio of the on-resistance at the stress time tm0 to the on-resistance when the stress time tm0 is 0 (initial state). The rate of increase ΔR is preferably close to 1.

As shown in FIG. 3, in the second sample SP2, as the stress time tm0 becomes longer, the rate of increase ΔR becomes remarkably large. On the other hand, in the first sample SP1, the increase of the rate of increase ΔR is suppressed even if the stress time tm0 becomes long. By providing the second region 42 including the first element in this way, stable characteristics can be obtained.

FIGS. 4A to 4F are analysis images of the semiconductor device according to the embodiment.

FIGS. 4A to 4C correspond to the first sample SP1. FIGS. 4D to 4F correspond to the second sample SP2. In these samples, the second electrode region 52b of the second electrode 52 includes Al. In these samples, an insulating member 48 (see FIG. 10), which will be described later, is provided. FIGS. 4A and 4D correspond to a transmission electron microscope (TEM) image. FIGS. 4B and 4E are EDX images related to Al. In FIGS. 4B and 4E, a concentration of Al is high in the bright region. FIGS. 4C and 4F are EDX images related to nitrogen. In FIGS. 4C and 4F, a concentration of nitrogen is high in the bright region.

As shown in FIGS. 4A and 4D, there is the second region 42 below the second electrode region 52b of the second electrode 52. FIGS. 4A to 4F show a position of an interface IF1 between the second region 42 and the second electrode region 52b.

As shown in FIG. 4B, in the first sample SP1, the second region 42 includes the first element (Al). As shown in FIG. 4E, in the second sample SP2, the second region 42 does not include the first element (Al).

Figure 5A:
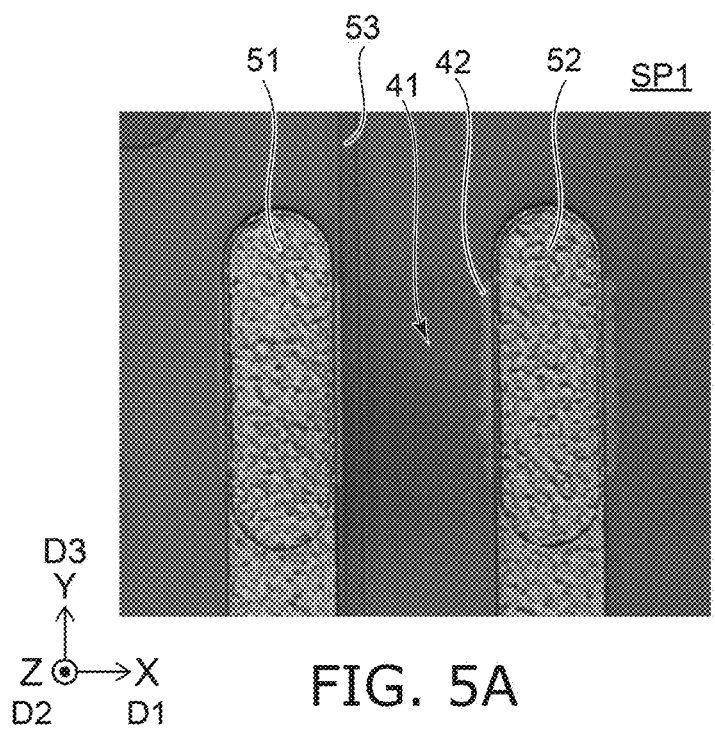
FIGS. 5A and 5B are optical micrograph images of the semiconductor device according to the embodiment.
Figure 5B:
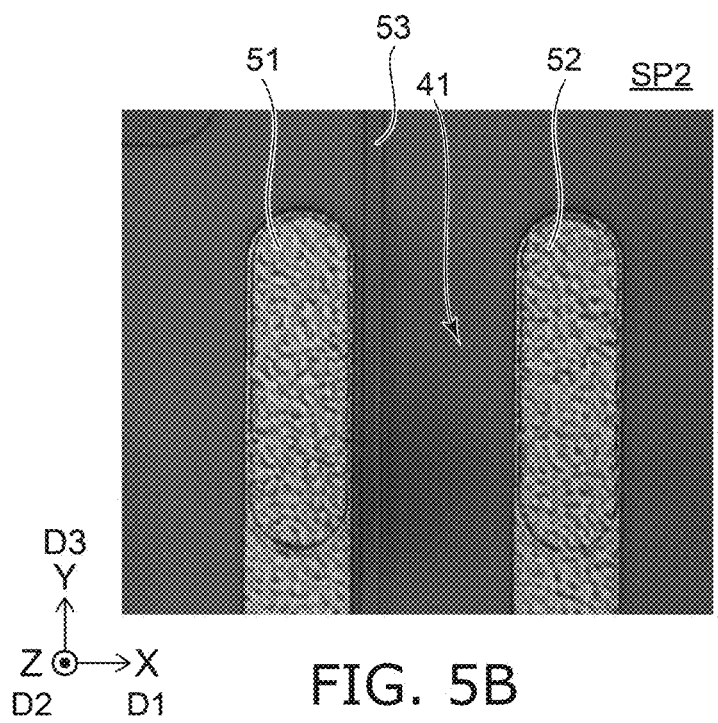

FIGS. 5A and 5B are optical micrograph images of the semiconductor device according to the embodiment.

As shown in FIG. 5A, in the first sample SP1, the second region 42 including the first element is observed. The second region 42 includes a portion not covered by the second electrode 52. As shown in FIG. 5B, in the second sample SP2, the second region 42 including the first element is not observed.

As described above, it is considered that the increase of the on-resistance is suppressed by including the first element in the second region 42 between the second electrode region 52b and the second semiconductor portion 22 as illustrated in FIG. 3.

Figure 6:
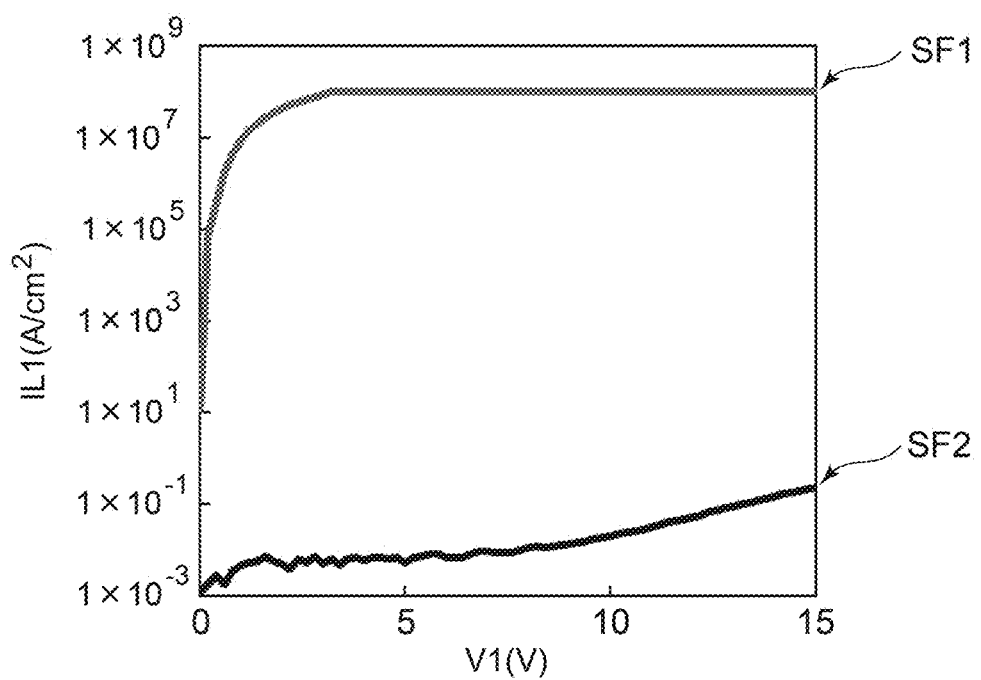
FIG. 6 is a graph illustrating characteristics of the semiconductor device according to the embodiment.

FIG. 6 is a graph illustrating characteristics of the semiconductor device according to the embodiment.

FIG. 6 illustrates a leakage current density IL1 in a first film sample SF1 corresponding to the first sample SP1 and a second film sample SF2 corresponding to the second sample SP2. The first film sample SF1 is a silicon nitride film including a first element (Al). The second film sample SF2 is a silicon nitride film that does not substantially include the first element. The horizontal axis of FIG. 6 is a voltage V1 applied to these film samples. The vertical axis is the leakage current density IL1 flowing through these film samples.

As shown in FIG. 6, the leakage current density IL1 is low in the second film sample SF2. On the other hand, in the first film sample SF1, the leakage current density IL1 is high. In the first film sample SF1, it is considered that the leakage current density IL1 is high and the voltage applied between the second electrode region 52b and the semiconductor member 10M is substantially lowered. For example, it is considered that the second electrode region 52b is substantially in ohmic contact with the second semiconductor portion 22 via the second region 42. As a result, as illustrated in FIG. 3, it is considered that the increase in on-resistance is suppressed.

As described above, the second electrode 52 may include the first element. The first element included in the second region 42 may be introduced from the second electrode 52. For example, the first region 41 and the second region 42 may include at least one second element selected from the group consisting of nitrogen and oxygen, and silicon. The first region 41 includes, for example, silicon nitride that is substantially free of the first element. The second region 42 is, for example, silicon nitride including the first element.

In the first configuration, the concentration of the first element in the second region 42 is, for example, not less than 5 atm %. As a result, the increase in on-resistance can be effectively suppressed.

In the first configuration, the concentration of the first element in the first region 41 is, for example, not more than 0.5 atm %. Thereby, for example, a gate leak current can be suppressed.

As shown in FIG. 1, the second region 42 includes a first end portion 42e and a second end portion 42f. These ends correspond to the two ends in the first direction D1. The second end portion 42f is between the first end portion 42e and the first electrode region 52a in the first direction D1. The second end portion 42f faces the first electrode region 52a. A position of the first end portion 42e in the first direction D1 is between the position of the third electrode 53 in the first direction D1 and a position of the second electrode region 52b in the first direction D1. The first end portion 42e projects toward the third electrode 53 with reference to the end of the second electrode region 52b in the first direction D1. As a result, the increase in on-resistance can be suppressed more stably.

As shown in FIG. 1, a length of the second region 42 along the first direction D1 is defined as a length L1. The length L1 corresponds to a distance between the first end portion 42e and the second end portion 42f. The length L1 is preferably, for example, not more than 2 μm. Even if there are variations in the manufacturing process, the increase in on-resistance can be stably suppressed.

As shown in FIG. 1, the second region 42 includes a portion that overlaps the second electrode region 52b in the second direction D2. A length of the overlapping portion along the first direction D1 is defined as a length L2. The length L2 corresponds to, for example, an amount of protrusion of the second electrode region 52b. In the embodiment, the length L2 is preferably not more than 0.8 μm. When the length L2 is not excessively long, for example, a distance between the third electrode 53 and the second electrode 52 can be maintained long. For example, a high breakdown voltage can be maintained. Current collapse can be suppressed.

In the embodiment, the second region 42 may be formed by a method different from the method described with respect to FIGS. 2A and 2C. Hereinafter, an example of another method for forming the second region 42 will be described.

FIGS. 7A to 7E are schematic cross-sectional views illustrating a method for manufacturing the semiconductor device according to the first embodiment.

Figure 7A:
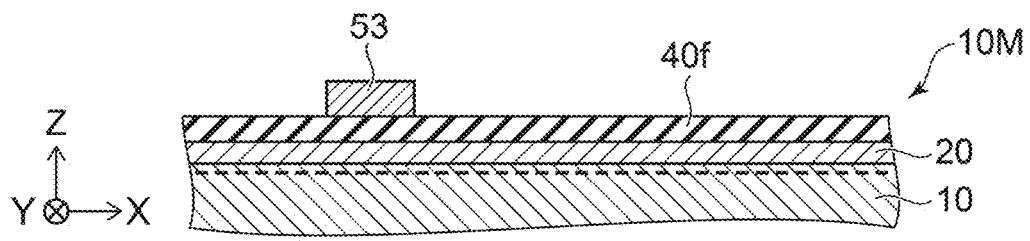
FIGS. 7A to 7E are schematic cross-sectional views illustrating a method for manufacturing the semiconductor device according to the first embodiment.

In these figures, the base body 18s and the buffer layer 18b are omitted. As shown in FIG. 7A, the second semiconductor region 20 is provided on the first semiconductor region 10. The first member film 40f, which is the first member 40, is provided on the second semiconductor region 20. The first member film 40f is, for example, a silicon nitride film. In this example, the third electrode 53 is provided on the first member film 40f.

Figure 7B:
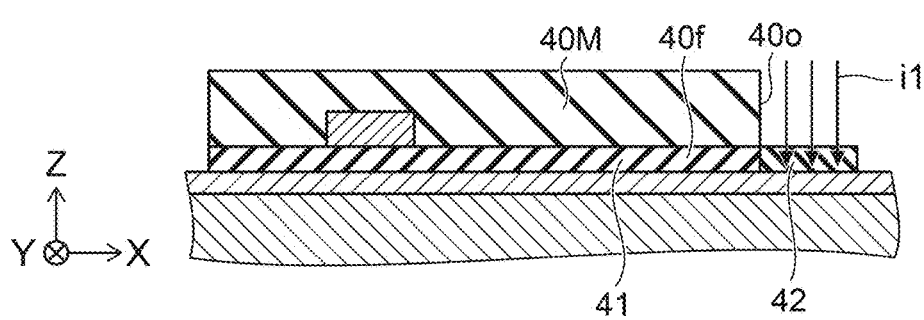

As shown in FIG. 7B, a mask member 40M is formed on the first member film 40f. The mask member 40M has an opening 40o. An element ii is introduced into a part of the first member film 40f through the opening 40o. The element ii includes the first element. The introduction of the element ii is performed, for example, by ion implantation. The region into which the element ii is not introduced is the first region 41. The region into which the element ii is introduced is the second region 42.

Figure 7C:
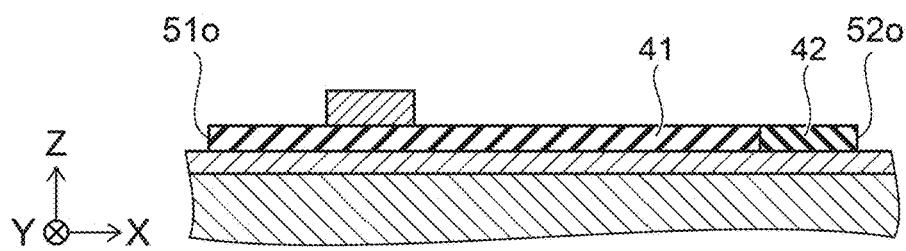

As shown in FIG. 7C, after the mask member 40M is removed, a part of the first region 41 is removed to form an opening 51o. A part of the second region 42 is removed to form an opening 52o.

Figure 7D:
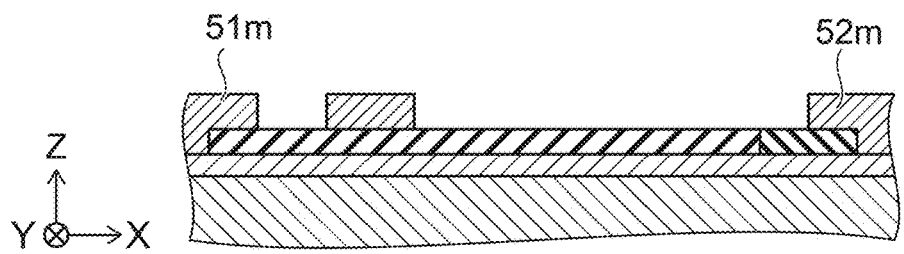

As shown in FIG. 7D, a conductive portion 51m to be the first electrode 51 is formed on the opening 51o and the first region 41. A conductive portion 52m to be the second electrode 52 is formed on the opening 52o and the second region 42.

Figure 7E:
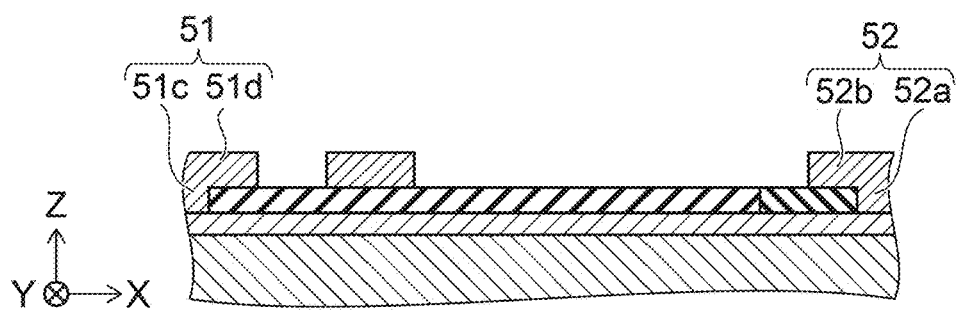

As shown in FIG. 7E, the first electrode 51 is obtained from the conductive portion 51m by performing the heat treatment. The second electrode 52 is obtained from the conductive portion 52m. The second region 42 including the first element can also be formed by such a method.

In the embodiment, the first member 40 may have the following second configuration. In the second configuration, the first region 41 includes at least one second element selected from the group consisting of nitrogen and oxygen, and silicon. The second region 42 includes silicon, and a concentration of silicon in the second region is higher than a concentration of silicon in the first region 41. In the second configuration, the first region 41 includes, for example, at least one selected from the group consisting of silicon nitride, silicon oxide and silicon oxynitride. In the second configuration, the second region 42 includes, for example, polysilicon.

In the second configuration, the second region 42 is less likely to include a trap than the first region 41. For example, an electrical resistance of the second region 42 is lower than an electrical resistance of the first region 41. For example, a voltage applied to the second region 42 between the second electrode region 52b and the second semiconductor portion 22 is low. Even in the second configuration including such a second region 42, the increase in on-resistance can be suppressed.

In the embodiment, the first member 40 may have the following third configuration. In the third configuration, the first region 41 includes at least one second element selected from the group consisting of nitrogen and oxygen, and silicon. In the third configuration, the first region 41 includes, for example, at least one selected from the group consisting of silicon nitride, silicon oxide and silicon oxynitride. The second region 42 includes $Al_{z1}Ga_{1-z1}N$ ($0 \leq z1 \leq 1$). The second region 42 includes, for example, GaN, AlGaN or AlN. The second region 42 may include polycrystals. By including polycrystals in the second region 42, for example, the resistance can be lowered and the trap can be substantially reduced. The increase in on-resistance can be suppressed. In the third configuration, the second region 42 may include at least one of the third element or the fourth element. The third element includes at least one selected from the group consisting of Si, Ge, and Sn. The fourth element includes at least one selected from the group consisting of Mg and Zn. The third element is, for example, an n-type impurity. The fourth element is, for example, a p-type impurity.

In the third configuration, the second region 42 is less likely to include a trap than the first region 41. For example, the electrical resistance of the second region 42 is lower than the electrical resistance of the first region 41. For example, the voltage applied to the second region 42 between the second electrode region 52b and the second semiconductor portion 22 is low. Even in the third configuration including the second region 42, the increase in on-resistance can be suppressed.

In the example of the semiconductor device according to the embodiment described below, the first member 40 may have any of the above-mentioned first to third configurations.

Figure 8:
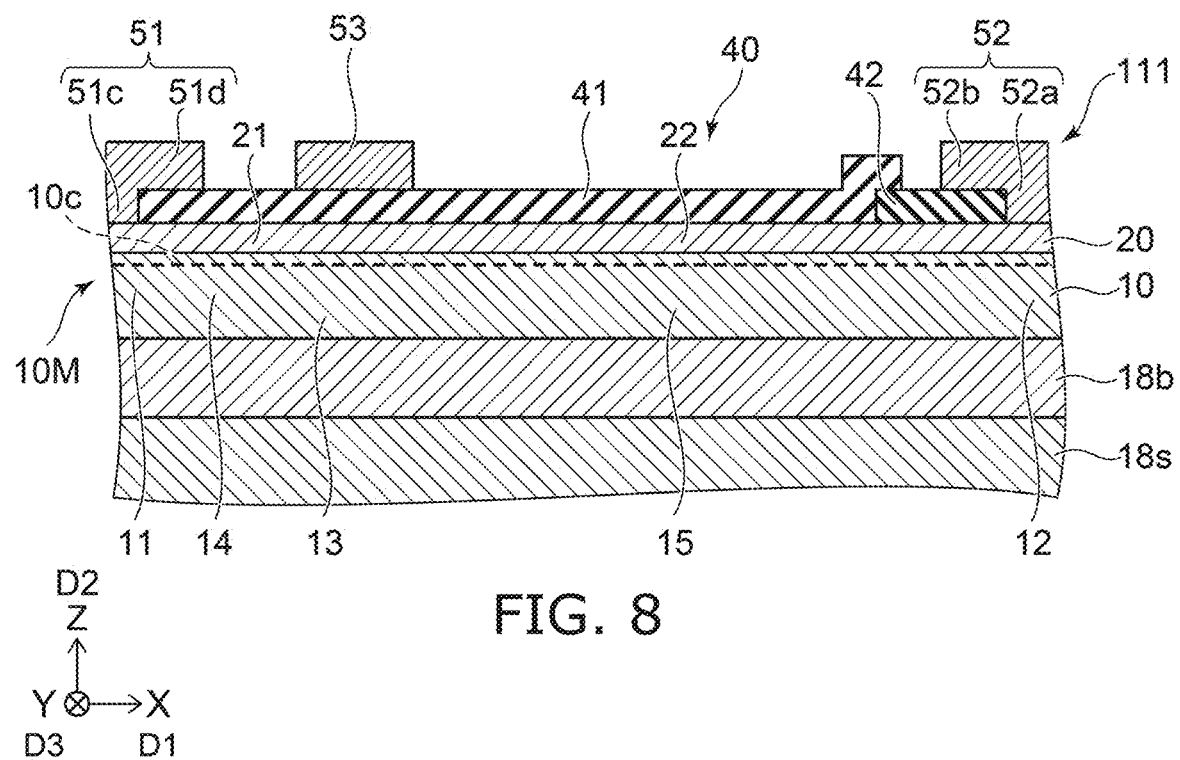
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, in a semiconductor device 111 according to the embodiment, a part of the first region 41 is above the second region 42. Except for this, the configuration of the semiconductor device 111 may be the same as the configuration of the semiconductor device 110.

In the semiconductor device 111, a part of the second region 42 is between the second semiconductor portion 22 and a part of the first region 41. For example, the second region 42 is protected by the first region 41. It is easy to obtain more stable characteristics.

FIGS. 9A to 9E are schematic cross-sectional views illustrating a method for manufacturing the semiconductor device according to the first embodiment.

Figure 9A:
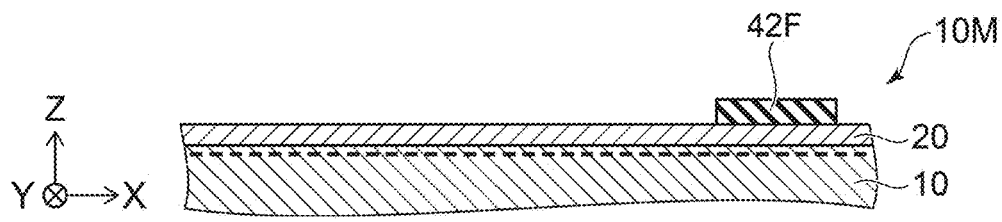
FIGS. 9A to 9E are schematic cross-sectional views illustrating a method for manufacturing the semiconductor device according to the first embodiment.

In these figures, the base body 18s and the buffer layer 18b are omitted. As shown in FIG. 9A, the second semiconductor region 20 is provided on the first semiconductor region 10. A second region film 42F, which is the second region 42, is provided on the second semiconductor region 20. For example, the material of the second region 42 according to the first to third configurations described above is applied to the second region film 42F. In one example, the second region film 42F is a silicon film (second configuration). In another example, the second region film 42F is a GaN film, an AlGaN film, or an AlN film (third configuration). In another example, the second region film 42F is a silicon nitride film (first configuration) including a first element.

Figure 9B:
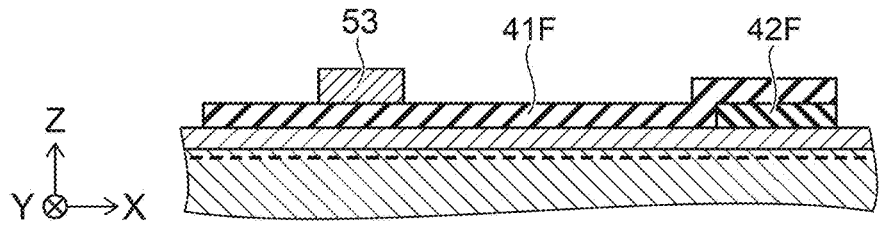

As shown in FIG. 9B, the first region film 41F, which is the first region 41, is formed on the second semiconductor region 20 and the second region film 42F. The first region film 41F is, for example, a silicon nitride film.

Figure 9C:
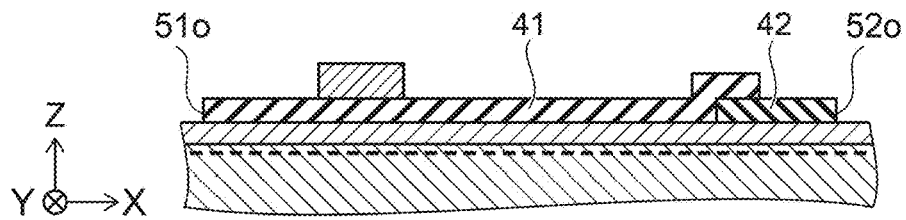

As shown in FIG. 9C, a part of the first region film 41F is removed to form the opening 51o. A part of the second region film 42F is removed to form the opening 52O. As a result, the first region 41 and the second region 42 are formed.

Figure 9D:
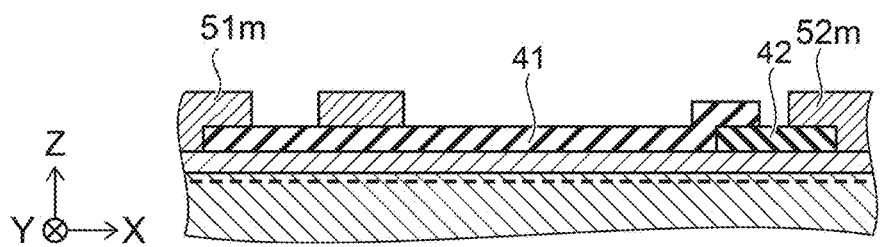

As shown in FIG. 9D, the conductive portion 51m to be the first electrode 51 is formed on the opening 51o and the first region 41. The conductive portion 52m to be the second electrode 52 is formed on the opening 52O and the second region 42.

Figure 9E:
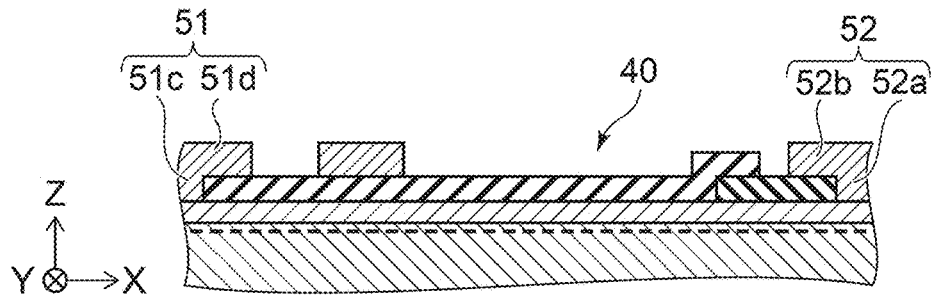

As shown in FIG. 9E, the first electrode 51 is obtained from the conductive portion 51m by performing the heat treatment. The second electrode 52 is obtained from the conductive portion 52m. Also by such a method, the first member 40 including any one of the first to third configurations can be formed. As a result, the semiconductor device 111 is obtained.

Figure 10:
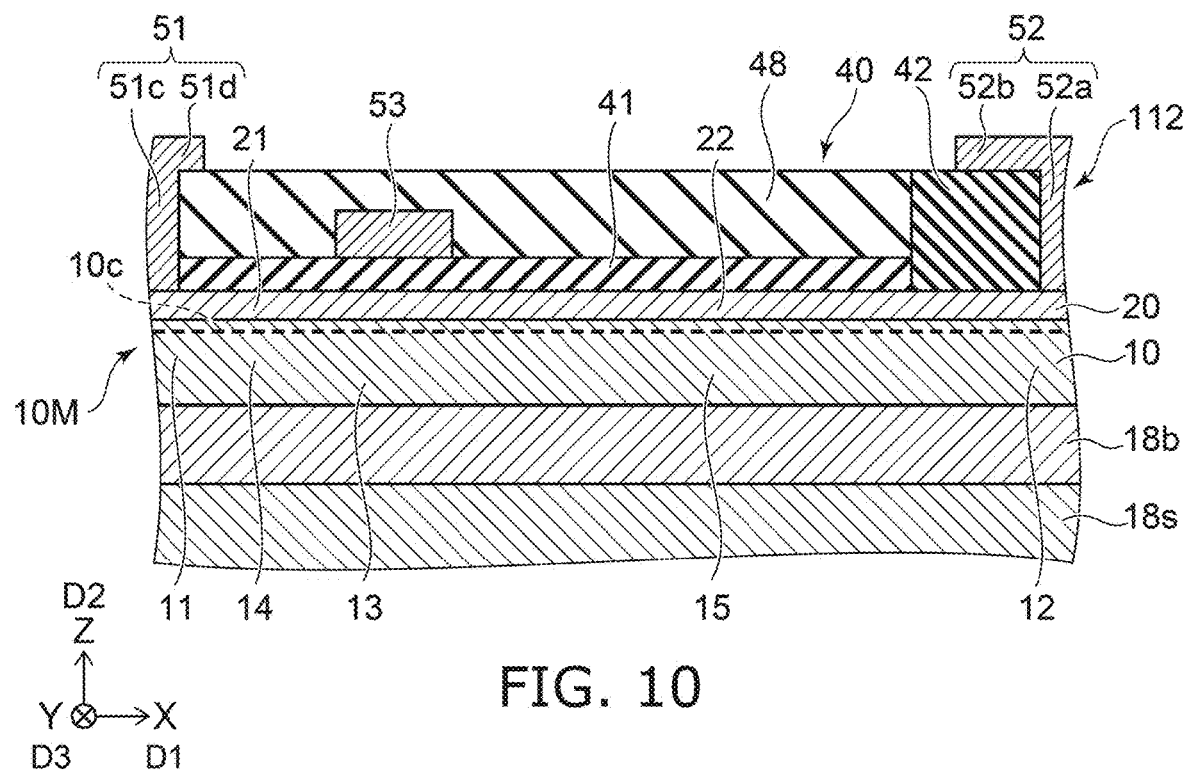
FIG. 10 is a schematic cross-sectional view illustrating a semiconductor device according to the first embodiment.

FIG. 10 is a schematic cross-sectional view illustrating a semiconductor device according to the first embodiment.

As shown in FIG. 10, a semiconductor device 112 according to the embodiment includes the insulating member 48. Except for this, the configuration of the semiconductor device 112 may be the same as the configuration of the semiconductor device 110.

In the semiconductor device 112, the first region 41 is between the second semiconductor portion 22 and the insulating member 48 in the second direction D2. For example, the insulating member 48 protects the first region 41. It is easy to obtain more stable characteristics. The insulating member 48 includes, for example, at least one selected from the group consisting of oxygen and nitrogen, and silicon. The insulating member 48 includes, for example, silicon oxide. The insulating member 48 includes, for example, silicon nitride.

In the semiconductor device 112, the second region 42 is between at least a part of the insulating member 48 and the first electrode region 52a in the first direction D1.

Figure 11:
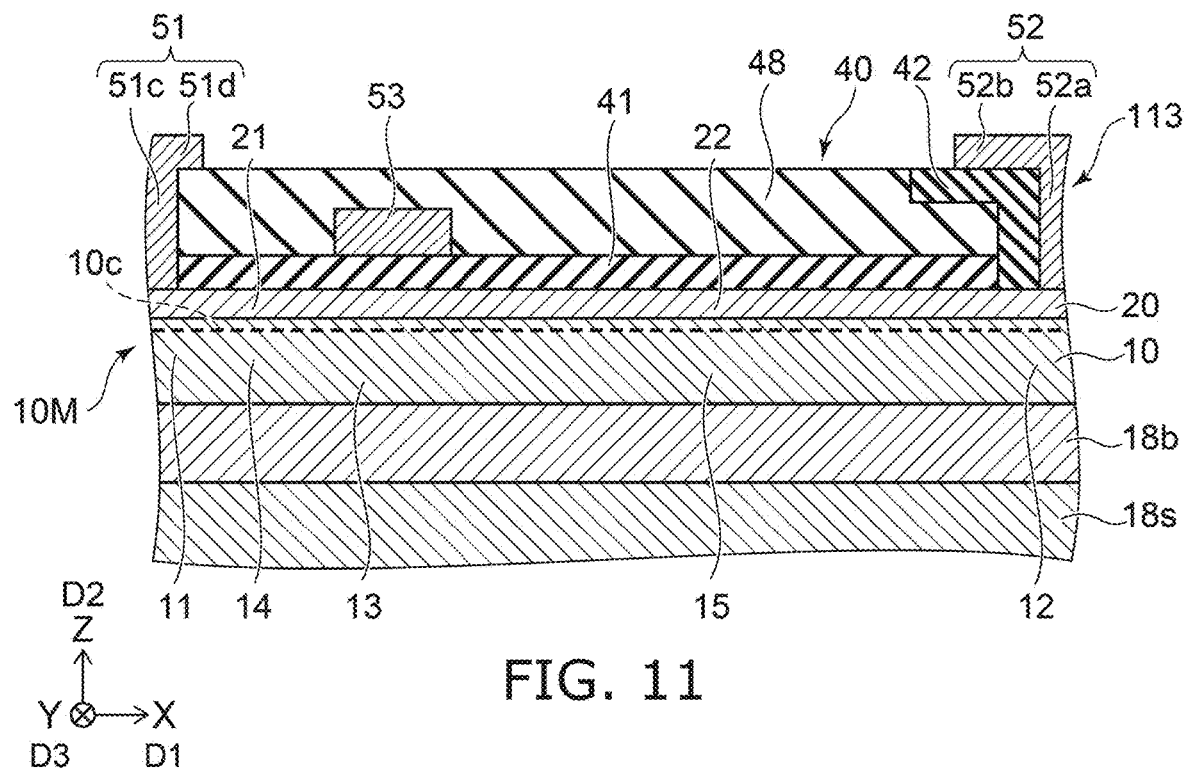
FIG. 11 is a schematic cross-sectional view illustrating a semiconductor device according to the first embodiment.

FIG. 11 is a schematic cross-sectional view illustrating a semiconductor device according to the first embodiment.

As shown in FIG. 11, a semiconductor device 113 according to the embodiment also includes the insulating member 48. The configuration of the insulating member 48 and the second region 42 in the semiconductor device 113 is different from the configuration in the semiconductor device 112. Except for this, the configuration of the semiconductor device 113 may be the same as the configuration of the semiconductor device 112.

In the semiconductor device 113, the first region 41 is between the second semiconductor portion 22 and the insulating member 48 in the second direction D2. A part of the insulating member 48 is between a part of the first region 41 and a part of the second region 42 in the second direction D2.

Figure 12:
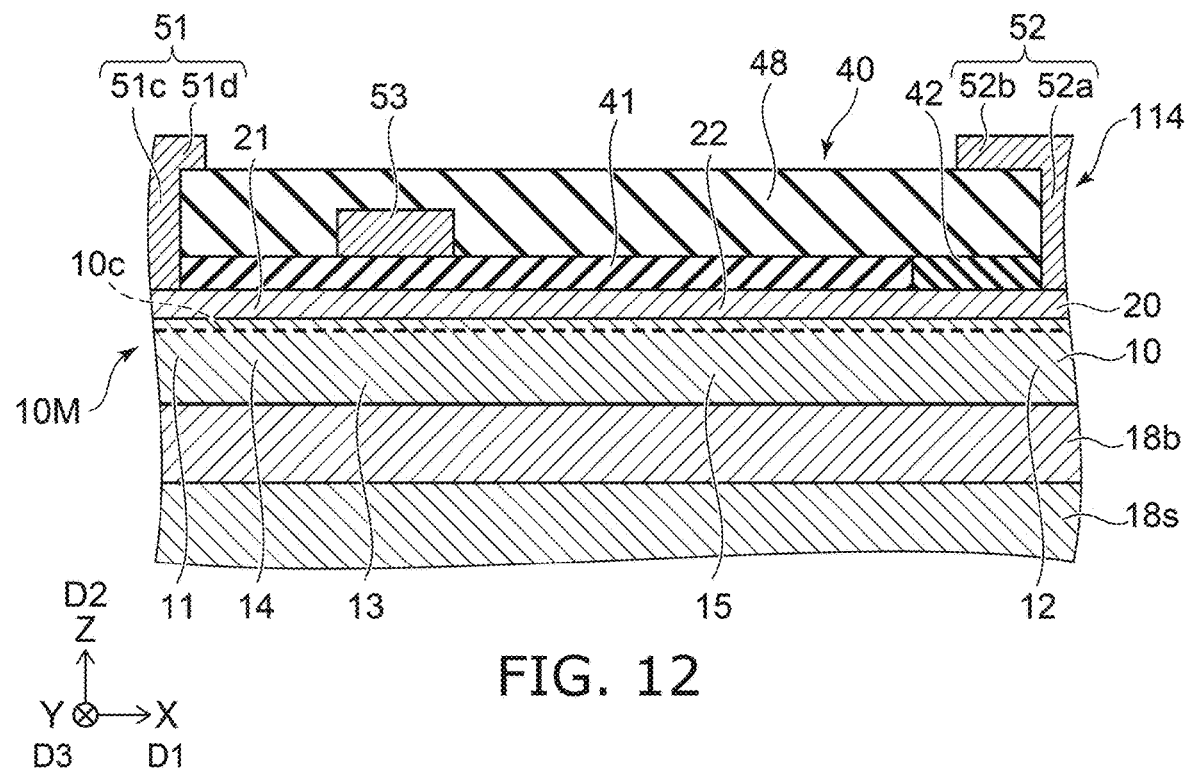
FIG. 12 is a schematic cross-sectional view illustrating a semiconductor device according to the first embodiment.

FIG. 12 is a schematic cross-sectional view illustrating a semiconductor device according to the first embodiment.

As shown in FIG. 12, a semiconductor device 114 according to the embodiment also includes the insulating member 48. The configuration of the insulating member 48 and the second region 42 in the semiconductor device 114 is different from the configuration in the semiconductor device 112. Except for this, the configuration of the semiconductor device 114 may be the same as the configuration of the semiconductor device 112.

In the semiconductor device 114, a part of the insulating member 48 is between the second region 42 and the second electrode region 52b in the second direction D2.

With respect to the above-mentioned semiconductor devices 112 to 114, any one of the above-mentioned first to third configurations may be applied to the first member 40. Stable characteristics can be obtained.

Figure 13:
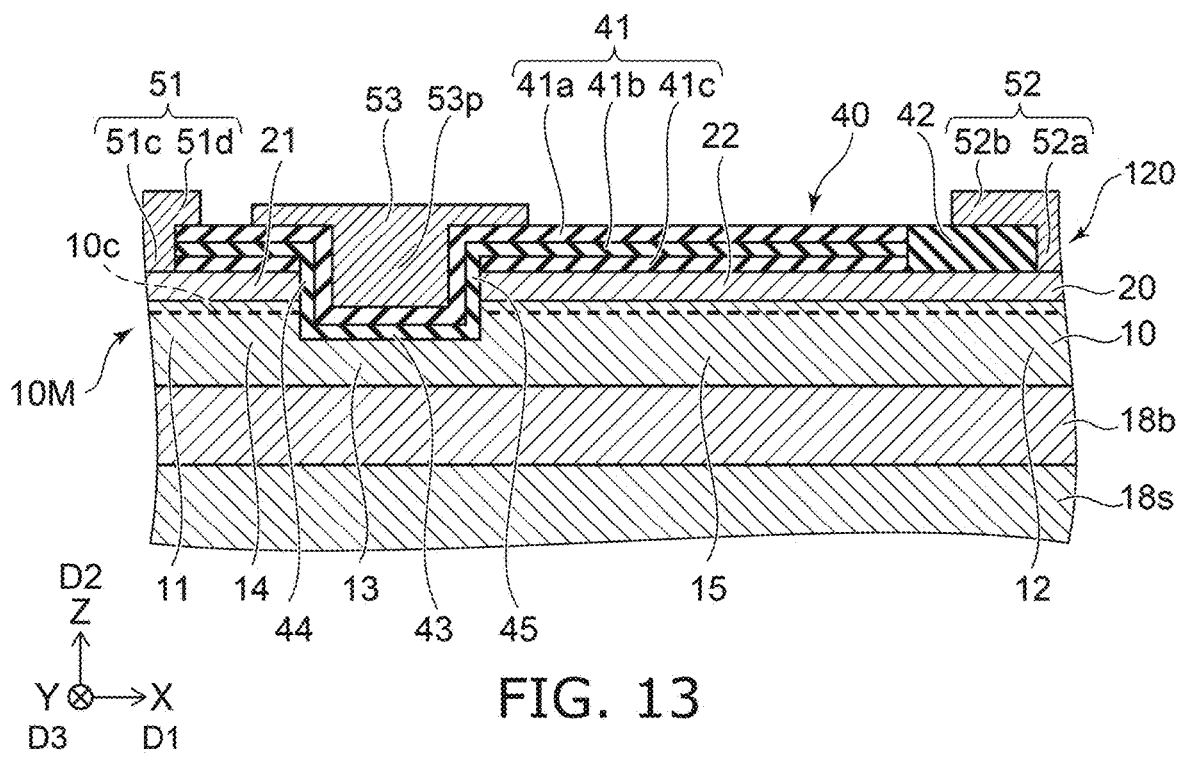
FIG. 13 is a schematic cross-sectional view illustrating a semiconductor device according to the first embodiment.

FIG. 13 is a schematic cross-sectional view illustrating a semiconductor device according to the first embodiment.

As shown in FIG. 13, in a semiconductor device 120 according to the embodiment, the first region 41 includes a stacked film. Except for this, the configuration of the semiconductor device 120 may be the same as the configuration of the semiconductor device 110, for example.

In the semiconductor device 120, the first region 41 includes the first to third compound films 41a to 41c. The first compound film 41a includes silicon and oxygen. The second compound film 41b includes $Al_{y2}Ga_{1-y2}N$ ($0<y2\leq1$). The third compound film 41c includes silicon and nitrogen. The first compound film 41a is, for example, a silicon oxide film. The second compound film 41b is, for example, an AlN film. The third compound film 41c is, for example, a silicon nitride film. The second compound film 41b is between the second semiconductor portion 22 and the first compound film 41a. The third compound film 41c is between the second semiconductor portion 22 and the second compound film 41b. Such a stacked structure may be applied to an insulating film provided between the first electrode 51 and the third electrode 53.

As shown in FIG. 13, in the semiconductor device 120, at least a part (part 53p) of the third electrode 53 is between the first semiconductor portion 21 and the second semiconductor portion 22 in the first direction D1. The third electrode 53 is, for example, a recess type gate electrode. With such a configuration, for example, a high threshold voltage can be obtained. For example, a normal off operation is performed.

The first member 40 further includes a third region 43, a fourth region 44, and a fifth region 45. The third region 43 is between the third partial region 13 and at least a part (part 53p) of the third electrode 53 in the second direction D2. The fourth region 44 is between the first semiconductor portion 21 and at least a part (part 53p) of the third electrode 53 in the first direction D1. The fifth region 45 is between at least a part (part 53p) of the third electrode 53 and the second semiconductor portion 22 in the first direction D1.

The third region 43, the fourth region 44, and the fifth region 45 function as, for example, the gate insulating film. The third region 43, the fourth region 44, and the fifth region 45 may include a stacked film.

For example, the first member 40 includes a first compound film 41a including silicon and oxygen, a second compound film 41b including $Al_{y2}Ga_{1-y2}N$ (0<y2≤1), and a third compound film 41c including silicon and nitrogen.

The first compound film 41a is between the third partial region 13 and at least a part (partial 53p) of the third electrode 53 in the third region 43. The first compound film 41a is between the first semiconductor portion 21 and at least a part (part 53p) of the third electrode 53 in the fourth region 44. The first compound film 41a is between at least a part (part 53p) of the third electrode 53 and the second semiconductor portion 22 in the fifth region 45.

The second compound film 41b is between the third partial region 13 and the first compound film 41a in the third region 43. The second compound film 41b is between the first semiconductor portion 21 and the first compound film 41a in the fourth region 44. The second compound film 41b is between the first compound film 41a and the second semiconductor portion 22 in the fifth region 45. The second compound film 41b is between the second semiconductor portion 22 and the first compound film 41a in the first region 41.

For example, the second compound film 41b is in contact with the third partial region 13 in the third region 43. For example, the second compound film 41b is in contact with the first semiconductor portion 21 in the fourth region 44. For example, the second compound film 41b is in contact with the second semiconductor portion 22 in the fifth region 45.

The third compound film 41c is between the second semiconductor portion 22 and the second compound film 41b in the first region 41. For example, the third compound film 41c is not provided in the third region 43, the fourth region 44, and the fifth region 45. By not providing the third compound film 41c in the third region 43, the fourth region 44, and the fifth region 45, for example, the fluctuation of the threshold voltage can be reduced.

By providing the second compound film 41b in the third region 43, the fourth region 44, and the fifth region 45, the electron mobility can be increased. The on-resistance of the device can be reduced.

By providing the first compound film 41a in the third region 43, the fourth region 44, and the fifth region 45, it is easy to obtain a stable threshold voltage. A leakage current can be reduced.

The second semiconductor portion 22 is protected by providing the third compound film 41c in the first region 41. More stable characteristics can be obtained. Current collapse can be suppressed. The first semiconductor portion 21 is protected by providing the third compound film 41c in the region between the first electrode 51 and the third electrode 53. More stable characteristics can be obtained.

Figure 14:
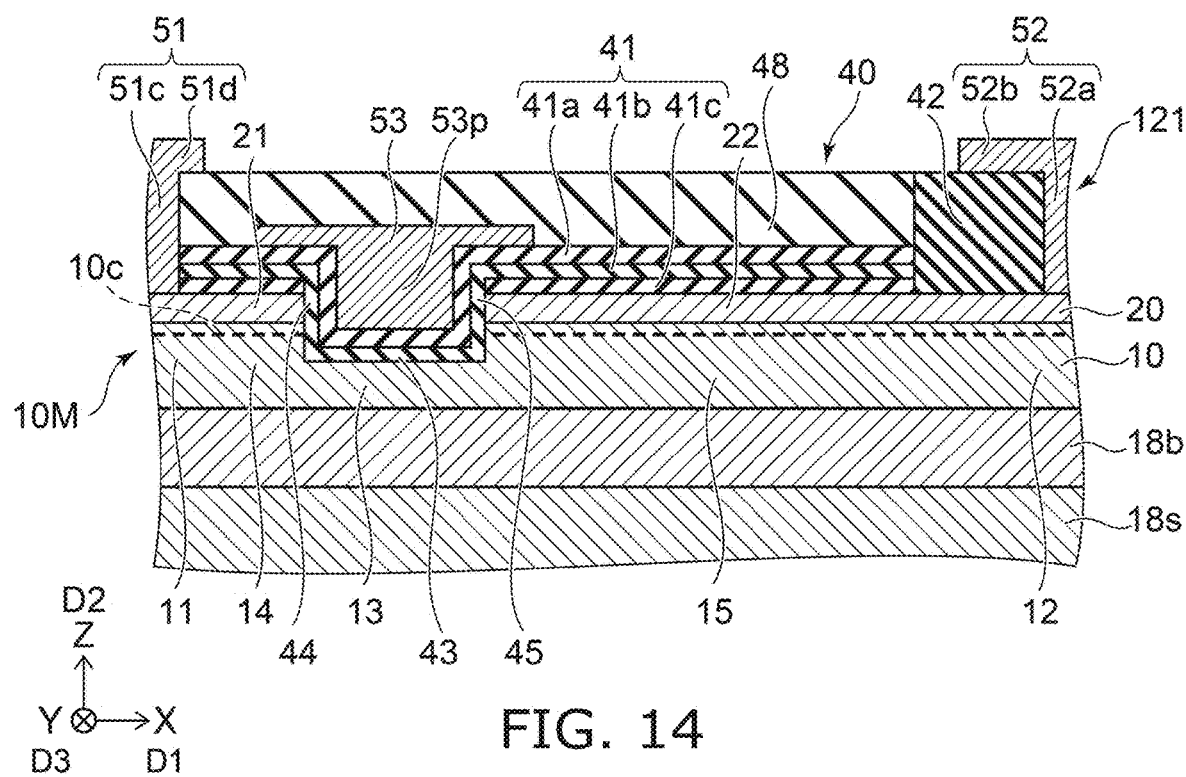
FIG. 14 is a schematic cross-sectional view illustrating a semiconductor device according to the first embodiment.

FIG. 14 is a schematic cross-sectional view illustrating a semiconductor device according to the first embodiment.

As shown in FIG. 14, the insulating member 48 is provided in a semiconductor device 121 according to the embodiment. Except for this, the configuration of the semiconductor device 121 may be the same as the configuration of the semiconductor device 120, for example. In the semiconductor device 121, a part of the second region 42 is between the insulating member 48 and the first electrode region 52a in the second direction D2.

Figure 15:
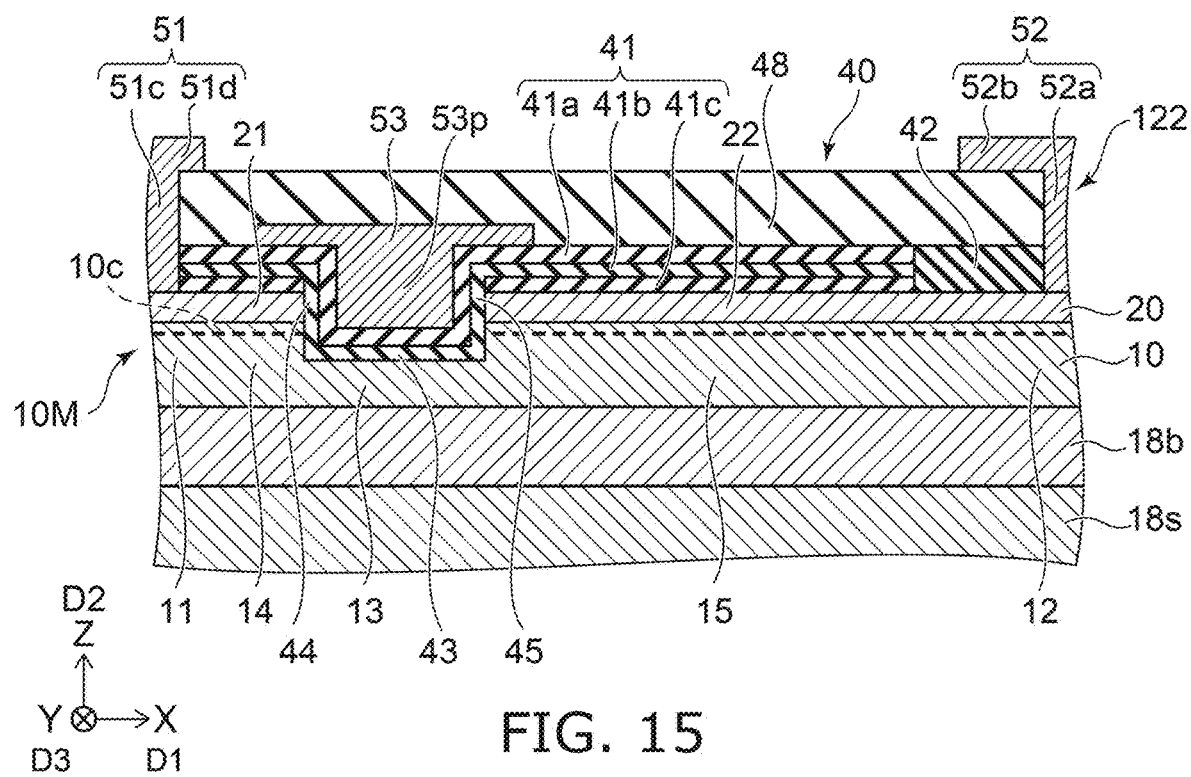
FIG. 15 is a schematic cross-sectional view illustrating a semiconductor device according to the first embodiment.

FIG. 15 is a schematic cross-sectional view illustrating a semiconductor device according to the first embodiment.

As shown in FIG. 15, in a semiconductor device 122 according to the embodiment, the configurations of the insulating member 48 and the second region 42 are different from the configurations of the semiconductor device 121. Except for this, the configuration of the semiconductor device 122 may be the same as the configuration of the semiconductor device 121, for example. In the semiconductor device 122, a part of the insulating member 48 is between a part of the second region 42 and the second electrode region 52b in the second direction D2.

Figure 16:
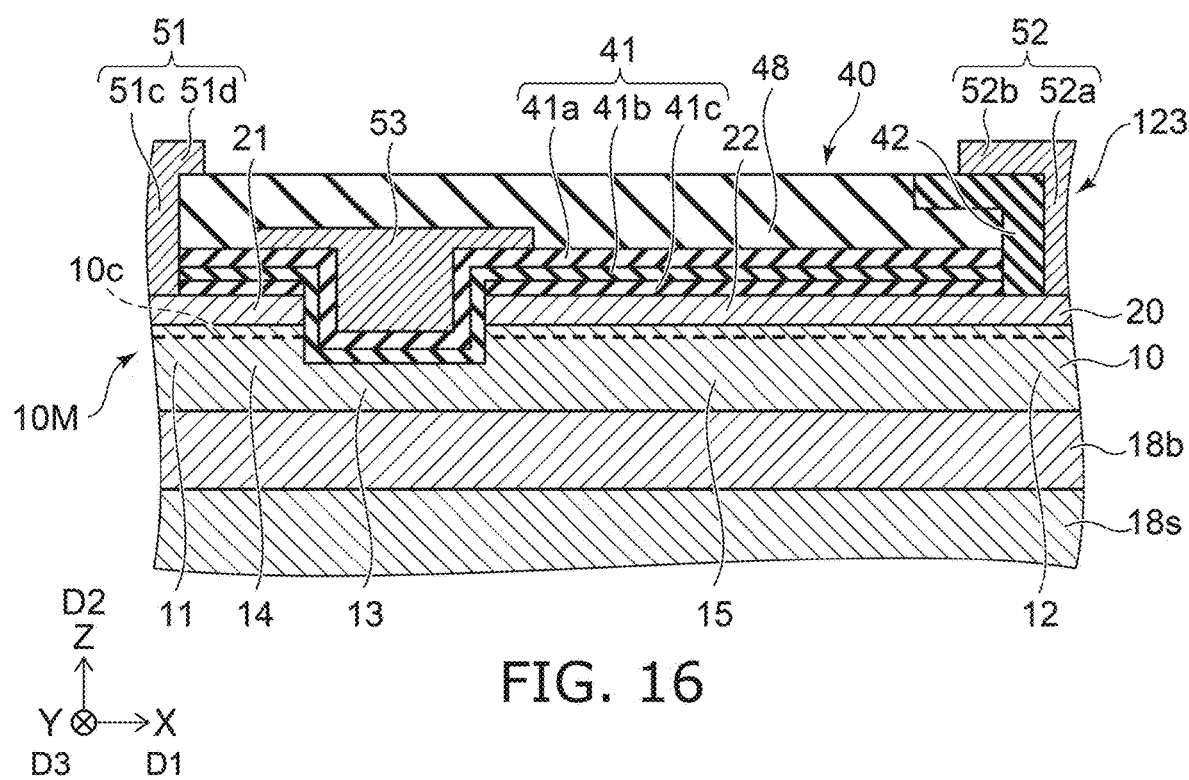
FIG. 16 is a schematic cross-sectional view illustrating a semiconductor device according to the first embodiment.

FIG. 16 is a schematic cross-sectional view illustrating a semiconductor device according to the first embodiment.

As shown in FIG. 16, in a semiconductor device 123 according to the embodiment, the configurations of the insulating member 48 and the second region 42 are different from the configurations of the semiconductor device 121. Except for this, the configuration of the semiconductor device 123 may be the same as the configuration of the semiconductor device 121, for example. In the semiconductor device 123, a part of the insulating member 48 is between a part of the first region 41 and a part of the second region 42 in the second direction D2.

Second Embodiment

Figure 17:
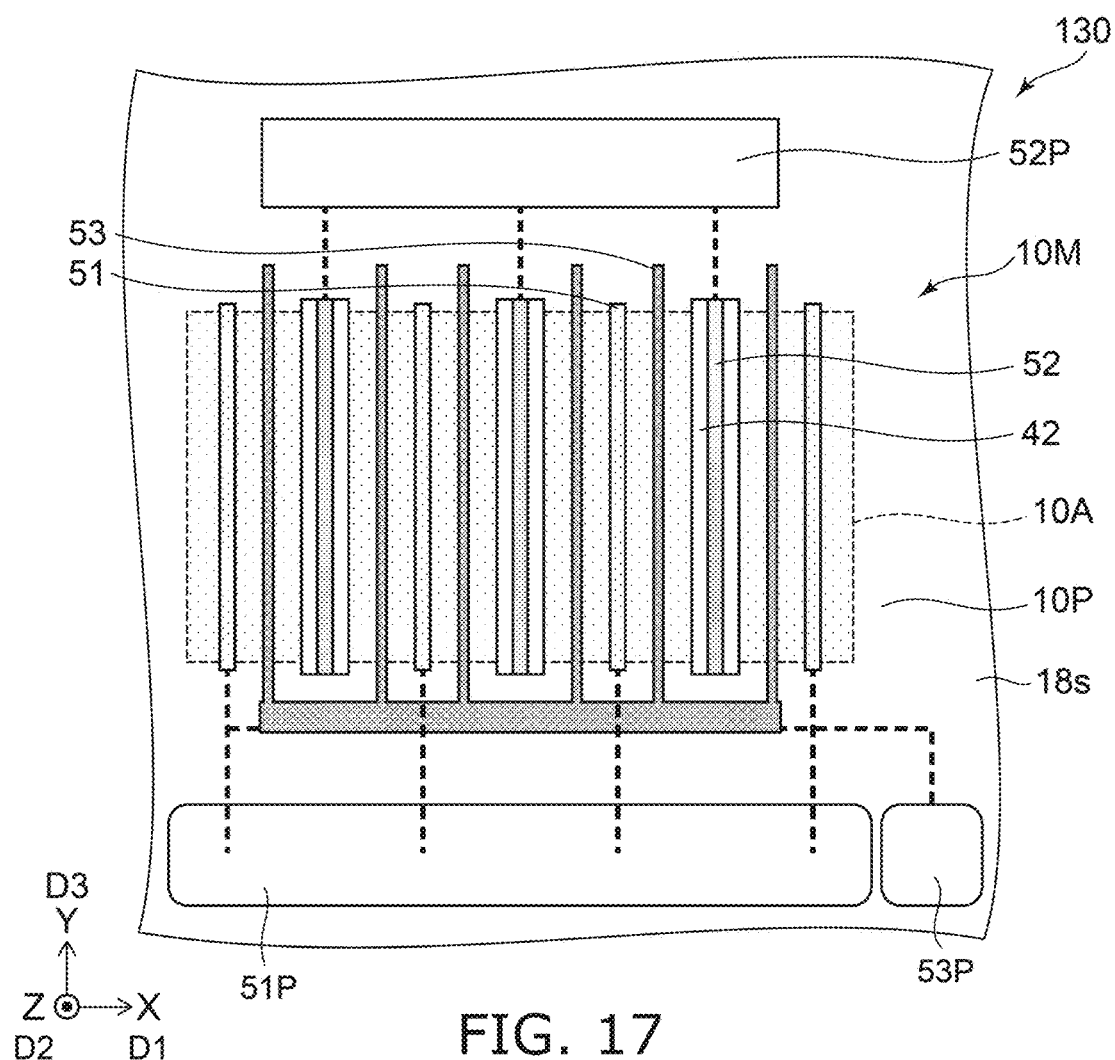
FIG. 17 is a schematic plan view illustrating a semiconductor device according to a second embodiment.

FIG. 17 is a schematic plan view illustrating a semiconductor device according to a second embodiment.

As shown in FIG. 17, a semiconductor device 130 according to the embodiment includes multiple second electrodes 52. Each of the multiple second electrodes 52 includes the first electrode region 52a and the second electrode region 52b (see FIG. 1 and the like). In this example, multiple first electrodes 51 and multiple third electrodes 53 are provided. These electrodes extend along the third direction D3. The third direction D3 crosses a plane including the first direction D1 and the second direction D2. The third direction D3 is, for example, the Y-axis direction. These electrodes are aligned along the first direction D1.

A position of the first electrode 51 (one of the multiple first electrodes 51) in the first direction D1 is between a position of one of the multiple second electrodes 52 in the first direction D1 and a position of another one the multiple second electrodes 52 in the first direction D1. A position of the third electrode 53 (one of the multiple third electrodes 53) in the first direction D1 is between a position of the first electrode 51 in the first direction D1 and a position of another one of the multiple second electrodes 52 in the direction D1.

At least a part of the first to third electrodes 51 to 53 passes through an element region 10A (for example, the active region). A peripheral region 10P is provided around the element region 10A. An electrode pad region is provided in the peripheral region 10P. The multiple first electrodes 51 are electrically connected with a first electrode pad 51P. The multiple second electrodes 52 are electrically connected with a second electrode pad 52P. The multiple third electrodes 53 are electrically connected with a third electrode pad 53P.

As shown in FIG. 17, the second region 42 includes a region that does not overlap the second electrode 52 in the second direction D2. In the semiconductor device 130, any one of the first to third configurations is applied. By providing the second region 42, for example, the increase in on-resistance is suppressed. It is possible to provide a semiconductor device capable of obtaining stable characteristics.

For example, a material of the first electrode 51 may be the same as a material of the second electrode 52. For example, the first electrode 51 may include at least one first element selected from the group consisting of Ti, Al, Ga, Ni, Nb, Mo, Ta, Hf, V and Au.

The third electrode 53 includes, for example, at least one selected from the group consisting of TiN, WN, Ni, Au, Pt and Ti. The third electrode 53 may include, for example, conductive silicon or polysilicon.

Information on length and thickness can be obtained by electron microscope observation or the like. Information on composition of the material can be obtained by SIMS (Secondary Ion Mass Spectrometry) or EDX (Energy dispersive X-ray spectroscopy).

According to the embodiment, it is possible to provide a semiconductor device capable of obtaining stable characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, electrodes, members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the first electrode to the second electrode being along a first direction, and the second electrode including a first electrode region and a second electrode region;
   a third electrode, a position in the first direction of the third electrode being between a position in the first direction of the first electrode and a position in the first direction of the second electrode;
   a first semiconductor region including $Al_{x1}Ga_{1-x1}N$ ($0 \le x1 < 1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, and the fifth partial region being between the third partial region and the second partial region in the first direction;
   a second semiconductor region including $Al_{x2}Ga_{1-x2}N$ ($x1 < x2 \le 1$), the second semiconductor region including a first semiconductor portion and a second semiconductor portion, a direction from the fourth partial region to the first semiconductor portion being along the second direction, and a direction from the fifth partial region to the second semiconductor portion being along the second direction; and
   a first member, the first member including a first region and a second region, the second semiconductor portion being between the fifth partial region and the first region in the second direction, at least a part of the second region being between at least a part of the first region and the first electrode region in the first direction, the at least a part of the second region being between the second semiconductor portion and the second electrode region in the second direction, the second region including at least one first element selected from the group consisting of Ti, Al, Ga, Ni, Nb, Mo, Ta, Hf, V, and Au, the first region not including the first element, or a concentration of the first element in the first region being lower than a concentration of the first element in the second region,
   wherein
   the first region includes
      a first compound film including silicon and oxygen,
      a second compound film including $Al_{y2}Ga_{1-y2}N$ ($0 < y2 \le 1$), and
      a third compound film including silicon and nitrogen,
   the second compound film is between the second semiconductor portion and the first compound film, and
   the third compound film is between the second semiconductor portion and the second compound film.

2. The device according to claim 1, wherein the second electrode includes the first element.

3. The device according to claim 1, wherein the first region and the second region include silicon and at least one second element selected from the group consisting of nitrogen and oxygen.

4. The device according to claim 1, wherein a concentration of the first element in the second region is not less than 5 atm %.

5. The device according to claim 1, wherein a concentration of the first element in the first region is not more than 0.5 atm %.

6. The device according to claim 1, wherein
   the second region includes a first end portion and a second end portion,
   the second end portion is between the first end portion and the first electrode region in the first direction, and a position in the first direction of the first end portion is between a position in the first direction of the third electrode and a position in the first direction of the second electrode region.

7. The device according to claim 1, wherein a part of the second region is between the second semiconductor portion and a part of the first region.

8. The device according to claim 1, further comprising:
an insulating member,
the first region being between the second semiconductor portion and the insulating member in the second direction.

9. The device according to claim 8, wherein the second region is between at least a part of the insulating member and the first electrode region in the first direction.

10. The device according to claim 1, further comprising:
an insulating member,
the first region being between the second semiconductor portion and the insulating member in the second direction, and
a part of the insulating member being between a part of the first region and a part of the second region in the second direction.

11. The device according to claim 8, wherein a part of the insulating member is between the second region and the second electrode region in the second direction.

12. The device according to claim 8, wherein the insulating member includes silicon and at least one selected from the group consisting of oxygen and nitrogen.

13. A semiconductor device, comprising:
a first electrode;
a second electrode, a direction from the first electrode to the second electrode being along a first direction, and the second electrode including a first electrode region and a second electrode region;
a third electrode, a position in the first direction of the third electrode being between a position in the first direction of the first electrode and a position in the first direction of the second electrode;
a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, and the fifth partial region being between the third partial region and the second partial region in the first direction;
a second semiconductor region including $Al_{x2}Ga_{1-x2}N$ ($x1 < x2 \leq 1$), the second semiconductor region including a first semiconductor portion and a second semiconductor portion, a direction from the fourth partial region to the first semiconductor portion being along the second direction, and a direction from the fifth partial region to the second semiconductor portion being along the second direction; and
a first member, the first member including a first region and a second region, the second semiconductor portion being between the fifth partial region and the first region in the second direction, at least a part of the second region being between at least a part of the first region and the first electrode region in the first direction, the at least a part of the second region being between the second semiconductor portion and the second electrode region in the second direction, the first region including silicon and at least one second element selected from the group consisting of nitrogen and oxygen, the second region including silicon, and a concentration of silicon in the second region being higher than a concentration of silicon in the first region,
wherein
the first region includes
a first compound film including silicon and oxygen,
a second compound film including $Al_{y2}Ga_{1-ys}N$ ($0<y2 \leq 1$), and
a third compound film including silicon and nitrogen,
the second compound film is between the second semiconductor portion and the first compound film, and
the third compound film is between the second semiconductor portion and the second compound film.

14. The device according to claim 13, wherein the second region includes polysilicon.

15. A semiconductor device, comprising:
a first electrode;
a second electrode, a direction from the first electrode to the second electrode being along a first direction, the second electrode including a first electrode region and a second electrode region;
a third electrode, a position in the first direction of the third electrode being between a position in the first direction of the first electrode and a position in the first direction of the second electrode;
a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, the fifth partial region being between the third partial region and the second partial region in the first direction;
a second semiconductor region including $Al_{x2}Ga_{1-x2}N$ ($x1 < x2 \leq 1$), the second semiconductor region including a first semiconductor portion and a second semiconductor portion, a direction from the fourth partial region to the first semiconductor portion being along the second direction, a direction from the fifth partial region to the second semiconductor portion being along the second direction; and
a first member, the first member including a first region and a second region, the second semiconductor portion being between the fifth partial region and the first region in the second direction, at least a part of the second region being between at least a part of the first region and the first electrode region in the first direction, the at least a part of the second region being between the second semiconductor portion and the second electrode region in the second direction, the first region including silicon and at least one second element selected from the group consisting of nitrogen and oxygen, the second region including $Al_{z1}Ga_{1-z1}N$ ($0 \leq z1 \leq 1$), wherein the first region includes
- a first compound film including silicon and oxygen,
- a second compound film including $Al_{y2}Ga_{1-y2}N$ ($0<y2\leq1$), and
- a third compound film including silicon and nitrogen, the second compound film is between the second semiconductor portion and the first compound film, and the third compound film is between the second semiconductor portion and the second compound film.

16. The device according to claim 15, wherein the second region includes polycrystal.

17. The device according to claim 15, wherein the second region includes at least one of a third element or a fourth element, the third element includes at least one selected from the group consisting of Si, Ge, and Sn, and the fourth element includes at least one selected from the group consisting of Mg and Zn.

18. A semiconductor device, comprising:

a first electrode;

a second electrode, a direction from the first electrode to the second electrode being along a first direction, and the second electrode including a first electrode region and a second electrode region;

a third electrode, a position in the first direction of the third electrode being between a position in the first direction of the first electrode and a position in the first direction of the second electrode;

a first semiconductor region including $Al_{x1}Ga_{1-x}N$ ($0\leq x1<1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, and the fifth partial region being between the third partial region and the second partial region in the first direction;

a second semiconductor region including $Al_{x2}Ga_{1-x2}N$ ($x1<x2\leq1$), the second semiconductor region including a first semiconductor portion and a second semiconductor portion, a direction from the fourth partial region to the first semiconductor portion being along the second direction, and a direction from the fifth partial region to the second semiconductor portion being along the second direction; and a first member, the first member including a first region and a second region, the second semiconductor portion being between the fifth partial region and the first region in the second direction, at least a part of the second region being between at least a part of the first region and the first electrode region in the first direction, the at least a part of the second region being between the second semiconductor portion and the second electrode region in the second direction, the second region including at least one first element selected from the group consisting of Ti, Al, Ga, Ni, Nb, Mo, Ta, Hf, V, and Au, the first region not including the first element, or a concentration of the first element in the first region being lower than a concentration of the first element in the second region, wherein at least a part of the third electrode is between the first semiconductor portion and the second semiconductor portion in the first direction, the first member further includes a third region, a fourth region and a fifth region, the third region is between the third partial region and the at least a part of the third electrode in the first direction, and the fifth region is between the at least a part of the third electrode and the second semiconductor portion, the first member includes
- a first compound film including silicon and oxygen,
- a second compound film including $Al_{y2}Ga_{1-y2}N$ ($0<y2\leq1$), and
- a third compound film including silicon and nitrogen, the first compound film is between the third partial region and the at least a part of the third electrode in the third region, is between the first semiconductor portion and the at least a part of the third electrode in the fourth region, and is between the at least a part of the third electrode and the second semiconductor portion in the fifth region, the second compound film is between the third partial region and the first compound film in the third region, is between the first semiconductor portion and the first compound film in the fourth region, is between the first compound film and the second semiconductor portion in the fifth region, and is between the second semiconductor portion and the first compound film in the first region, and the third compound film is between the second semiconductor portion and the second compound film in the first region.

19. A semiconductor device, comprising:

a first electrode;

a second electrode, a direction from the first electrode to the second electrode being along a first direction, and the second electrode including a first electrode region and a second electrode region;

a third electrode, a position in the first direction of the third electrode being between a position in the first direction of the first electrode and a position in the first direction of the second electrode;

a first semiconductor region including $Al_{x1}Ga_{1-x1}N$ ($0\leq x1<1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, and the fifth partial region being between the third partial region and the second partial region in the first direction;

a second semiconductor region including $Al_{x2}Ga_{1-x2}N$ ($x1<x2\leq1$), the second semiconductor region including a first semiconductor portion and a second semiconductor portion, a direction from the fourth partial region to the first semiconductor portion being along the second direction, and a direction from the fifth partial region to the second semiconductor portion being along the second direction; and a first member, the first member including a first region and a second region, the second semiconductor portion being between the fifth partial region and the first region in the second direction, at least a part of the second region being between at least a part of the first region and the first electrode region in the first direction, the at least a part of the second region being between the second semiconductor portion and the second electrode region in the second direction, the second region including at least one first element selected from the group consisting of Ti, Al, Ga, Ni, Nb, Mo, Ta, Hf, V, and Au, the first region not including the first element, or a concentration of the first element in the first region being lower than a concentration of the first element in the second region, wherein the first region and the second region include silicon and at least one second element selected from the group consisting of nitrogen and oxygen, and a concentration of the first element in the second region is not less than 5 atm %.

\* \* \* \* \*